(12) United States Patent (10) Patent No.: US 9,234,943 B2
Fabregas et al. (45) Date of Patent: Jan. 12, 2016

(54) METHOD AND SYSTEM FOR BATTERY CURRENT MEASUREMENT CALIBRATION

(71) Applicant: Lear Corporation, Southfield, MI (US)

(72) Inventors: Antoni Ferre Fabregas, Valls (ES); David Gamez Alari, Valls (ES); Jose Gabriel Fernandez Banares, Valls (ES)

(73) Assignee: Lear Corporation, Southfield, MI (US)

( * ) Notice: Subject to any disclaimer, the term of this patent is extended or adjusted under 35 U.S.C. 154(b) by 449 days.

(21) Appl. No.: 13/668,377

(22) Filed: Nov. 5, 2012

(65) Prior Publication Data

US 2013/0154672 A1 Jun. 20, 2013

Related U.S. Application Data

(60) Provisional application No. 61/576,678, filed on Dec. 16, 2011.

(51) Int. Cl.
| | | |
|---|---|---|
| *G01R 27/08* | (2006.01) | |
| *G01R 31/36* | (2006.01) | |
| *G01R 35/00* | (2006.01) | |
| *H01L 21/00* | (2006.01) | |

(Continued)

(52) U.S. Cl.
CPC ........... *G01R 31/3606* (2013.01); *G01R 35/005* (2013.01); *G01R 1/00* (2013.01); *G01R 1/203* (2013.01); *G01R 19/2503* (2013.01); *H01L 21/00* (2013.01); *H01L 2221/00* (2013.01)

(58) Field of Classification Search
CPC ....... H01L 2221/00; G01R 1/00; H01M 2/00; H01M 2200/00; B60L 1/00; B60L 2200/00; H02J 1/00
USPC ......... 324/426–429, 431, 433, 435, 439, 441, 324/713
See application file for complete search history.

(56) References Cited

U.S. PATENT DOCUMENTS 3,886,442 A * 5/1975 Chiku ................. G01R 31/3613
320/DIG. 21
4,702,246 A * 10/1987 Ellis et al. ........................ 606/31

(Continued)

FOREIGN PATENT DOCUMENTS

| CN | 1537234 A | 10/2004 |
|---|---|---|
| CN | 1766664 A | 5/2006 |

(Continued)

OTHER PUBLICATIONS

Chinese Patent Office, First Office Action for the corresponding Chinese Patent Application No. 201210549889.X dated Nov. 15, 2014.

*Primary Examiner* — Huy Q Phan
*Assistant Examiner* — Temilade Rhodes-Vivour
(74) *Attorney, Agent, or Firm* — Brooks Kushman P.C.

(57) ABSTRACT

A sensor for monitoring battery current includes a shunt and a current source. The shunt has a resistance with an actual value. The current source is configured to provide a known value of current through the shunt. A controller is configured to generate a measured value of the current through the shunt as a function of a measured value of voltage drop across the shunt caused by the current through the shunt and an assumed value of the resistance of the shunt. The controller is further configured to detect the assumed value of the resistance of the shunt as being different than the actual value of the resistance of the shunt when the known and measured values of the current differ.

18 Claims, 4 Drawing Sheets

(51) Int. Cl.
*G01R 1/00* (2006.01)
*G01R 1/20* (2006.01)
*G01R 19/25* (2006.01)

(56) References Cited

U.S. PATENT DOCUMENTS

| | | | |
|---|---|---|---|
| 5,027,059 | A | 6/1991 | de Montgolfier et al. |
| 5,969,928 | A | 10/1999 | Hashimoto et al. |
| 6,140,928 | A * | 10/2000 | Shibuya ............. G01R 31/3655 320/134 |
| 6,781,423 | B1 * | 8/2004 | Knoedgen ..................... 327/110 |
| 6,946,848 | B2 | 9/2005 | Tauber et al. |
| 7,589,480 | B2 * | 9/2009 | Greenwood et al. .......... 315/307 |
| 2005/0200370 | A1 | 9/2005 | Quackenbuch et al. |
| 2008/0024074 | A1 * | 1/2008 | Mosebrook et al. .......... 315/291 |
| 2009/0079401 | A1 * | 3/2009 | Mok et al. ..................... 323/234 |
| 2009/0132188 | A1 * | 5/2009 | Watanabe ....................... 702/64 |
| 2009/0224768 | A1 * | 9/2009 | Dollansky .................. G01R 1/203 324/426 |
| 2010/0244845 | A1 * | 9/2010 | Morikawa .............. G01R 19/25 324/427 |
| 2011/0089931 | A1 | 4/2011 | Podlisk et al. |
| 2013/0045404 | A1 * | 2/2013 | Shi ..................... G01R 31/3606 429/93 |

FOREIGN PATENT DOCUMENTS

| | | |
|---|---|---|
| CN | 101551423 A | 10/2009 |
| CN | 101943713 A | 1/2011 |
| CN | 101957626 A | 1/2011 |
| CN | 102236084 A | 11/2011 |
| EP | 2392931 A2 | 12/2011 |

* cited by examiner

METHOD AND SYSTEM FOR BATTERY CURRENT MEASUREMENT CALIBRATION

CROSS-REFERENCE TO RELATED APPLICATIONS

This application claims the benefit of U.S. Provisional Application No. 61/576,678, filed Dec. 16, 2011; the disclosure of which is incorporated in its entirety by reference herein.

TECHNICAL FIELD

The present invention relates to monitoring current output of batteries such as batteries used in vehicles.

BACKGROUND

Modern vehicles include complex electric networks for performing various functions. Conventional vehicles having internal combustion engines include a low-voltage ("LV") battery (e.g., 12V-24V) for supplying energy to various LV loads such as ECUs, sensors, actuators, etc. Hybrid and electric vehicles (i.e., vehicles including an electric traction motor) include a high-voltage ("HV") battery for supplying energy to various HV loads including the inverter that drives the traction motor. The HV battery may also supply energy to a DC-DC converter in order to supply energy to LV loads. Alternatively or additionally, hybrid and electric vehicles may further include a LV battery for supplying energy to LV loads.

Such vehicle networks including a LV battery and/or a HV battery typically include an electronic module for monitoring the performance and state of the battery. This electronic module is typically referred to as a battery monitor or the like. The battery monitor is configured to measure the battery voltage and the battery current.

The battery monitor typically employs a current sensing shunt for measuring the battery current. The current sensing shunt is a resistor. Due to aging and use, the resistance of the current sensing shunt may change. In this case, the measurement of the battery current by the battery monitor may have an unacceptable error. Therefore, it is beneficial to provide some mechanism for verifying that the battery current is measured within certain accuracy.

One possible solution (used in testers) is to have an external circuitry deliver a calibrated reference current to verify if the battery monitor is accurately measuring the battery current. However, for automotive systems, this procedure is not convenient since the external calibration is not always available and/or it may be difficult to control the accuracy of this external circuit.

SUMMARY

An object of the present invention includes measurement calibration of a battery sensor or monitor ("battery monitor") configured to measure battery current.

Another object of the present invention includes a battery monitor having a current sensing shunt for use in measuring battery current in which the battery monitor includes a controlled current source for calibrating the current sensing shunt.

A further object of the present invention includes a battery monitor having a current sensing shunt for use in measuring battery current in which a battery current measurement calibration using direct current injection process is employed.

Another object of the present invention includes a battery monitor having a current sensing shunt for use in measuring battery current in which a battery current measurement calibration using capacitor discharge current injection process is employed.

In carrying out one or more of the above and other objects, the present invention provides a sensor for monitoring battery current. The sensor includes a shunt, a current source, and a controller. The shunt has a resistance with an actual value. The current source is configured to provide a known value of current through the shunt. The controller is configured to generate a measured value of the current through the shunt as a function of a measured value of voltage drop across the shunt caused by the current through the shunt and an assumed value of the resistance of the shunt. The controller is further configured to detect the assumed value of the resistance of the shunt as being different than the actual value of the resistance of the shunt when the known and measured values of the current differ.

Further, in carrying out one or more of the above and other objects, the present invention provides a method for monitoring battery current. The method includes injecting a known value of current through a shunt having a resistance with an actual value. The method further includes generating a measured value of the current through the shunt as a function of a measured value of voltage drop across the shunt caused by the current through the shunt and an assumed value of the resistance of the shunt. The method further includes detecting the assumed value of the resistance of the shunt as being different than the actual value of the resistance of the shunt when the known and measured values of the current differ.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1A:
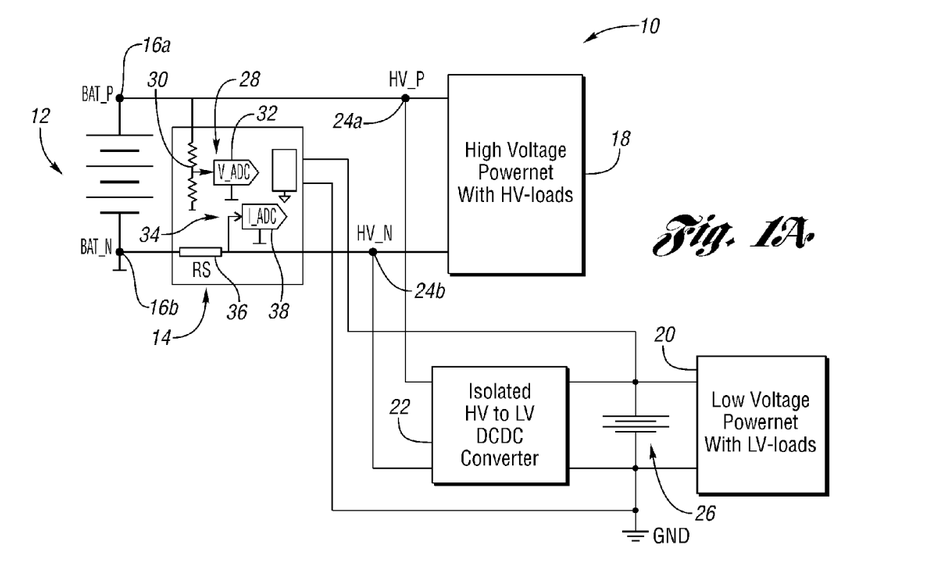
FIG. 1A illustrates a block diagram of a vehicle network having a high-voltage ("HV") battery and a battery monitor for measuring the battery voltage and the battery current.

Referring now to FIG. 1A, a block diagram of a vehicle network 10 having a high-voltage ("HV") battery 12 and a battery sensor or monitor 14 for measuring the voltage and the current of HV battery 12 is shown. Vehicle network 10 is a type of electric direct-current ("DC") circuit. HV battery 12 is a main battery for vehicle network 10. HV battery 12 is a high-voltage DC battery (e.g., V_BAT>60V). HV battery 12 includes two terminals: a positive terminal 16a (BAT_P) and a negative terminal 16b (BAT_N).

Vehicle network 10 further includes a HV power net 18 and a low-voltage ("LV") power net 20. HV power net 18 includes HV loads such as the inverter that drives a traction motor of the vehicle. LV power net 20 includes LV loads such as ECUs, sensors, actuators, etc. of the vehicle. Vehicle network 10 further includes a DC-DC converter 22. DC-DC converter 22 is connected between HV battery 12 and LV power net 20. DC-DC converter 22 is configured to convert high-voltage energy from HV battery 12 into low-voltage energy for use by LV power net 20.

Positive terminal 16a of HV battery 12 is connected to a HV positive net 24a (HV_P). HV positive net 24a is connected to the positive inputs of HV power net 18 and DC-DC converter 22. Negative terminal 16b of HV battery 12 is connected through battery monitor 14 to a HV negative net 24b (HV_N). HV negative net 24b is connected to the negative inputs of HV power net 18 and DC-DC converter 22. As shown in FIG. 1A, HV and LV power nets 18 and 20 are isolated and connect through isolated-converters/isolated communication devices (e.g., DC-DC converter 22).

Vehicle network 10 further includes a LV battery 26. LV battery 26 is a low-voltage DC battery (e.g., 12V-24V). LV battery 26 is connected between DC-DC converter 22 and LV power net 20. As such, LV battery 26 is configured to provide low-voltage energy to LV power net 20. As shown in FIG. 1A, LV battery 26 is also connected to battery monitor 14. As such, LV battery 26 is also configured to provide low-voltage energy to battery monitor 14 for enabling the operation of battery monitor 14.

As indicated above, battery monitor 14 is configured to measure the voltage and the current of HV battery 12. For measuring the battery voltage, battery monitor 14 includes a voltage measuring sub-circuit 28. Voltage measuring sub-circuit 28 includes a resistive voltage divider 30 and a first analog-to-digital converter 32 ("ADC"). The input of voltage divider 30 is connected to positive terminal 16a of HV battery 12. The output of voltage divider 30, which is indicative of the analog value of the voltage of HV battery 12, is connected to first ADC 32. First ADC 32 converts this analog value into a digital value indicative of the voltage of HV battery 12.

For measuring the battery current, battery monitor 14 further includes a current measuring sub-circuit 34. Current measuring sub-circuit 34 includes a current sensing shunt 36 ("RS") and a second ADC 38. Current sensing shunt 36 has a resistance value RS. Current sensing shunt 36 is connected in-line with negative terminal 16b of HV battery 12 and HV negative net 24b. As such, negative terminal 16b of HV battery 12 is connected to HV negative net 24b via current sensing shunt 36. Battery monitor 14 measures the battery current of HV battery 12 by using current sensing shunt 36 to create a voltage drop indicative of the battery current. This voltage drop, which may be amplified, is sensed using second ADC 38. Battery monitor 14 then calculates the battery current from Ohm's law I=V/R; where here V is the known voltage drop; R is the known resistance value RS; and I is the battery current as calculated in the equation.

Figure 1B:
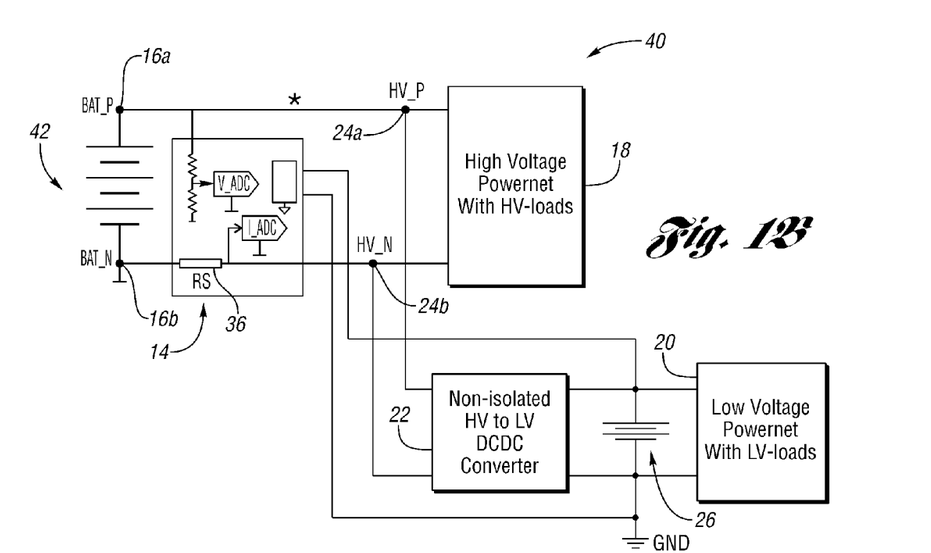
FIG. 1B illustrates a block diagram of another vehicle network having a HV battery and a battery monitor for measuring the battery voltage and the battery current.

Referring now to FIG. 1B, with continual reference to FIG. 1A, a block diagram of another vehicle network 40 having a HV battery 42 and battery monitor 14 for measuring the voltage and the current of HV battery 42 is shown. Vehicle network 40 is similar to vehicle network 10 shown in FIG. 1A and like components have the same reference numerals. Vehicle network 40 differs from vehicle network 10 shown in FIG. 1A in that vehicle network 40 includes a HV battery 42 in place of HV battery 12. Unlike HV battery 12, HV battery 42 is a "low" high-voltage DC battery (e.g., V_BAT<60V) and negative terminal 16b of HV battery 42 is connected to vehicle ground (chassis). In general, in vehicle network 40, HV power net 18 and LV power net 20 are not isolated and HV negative net 24b is connected to through the shunt to the vehicle ground.

Figure 2:
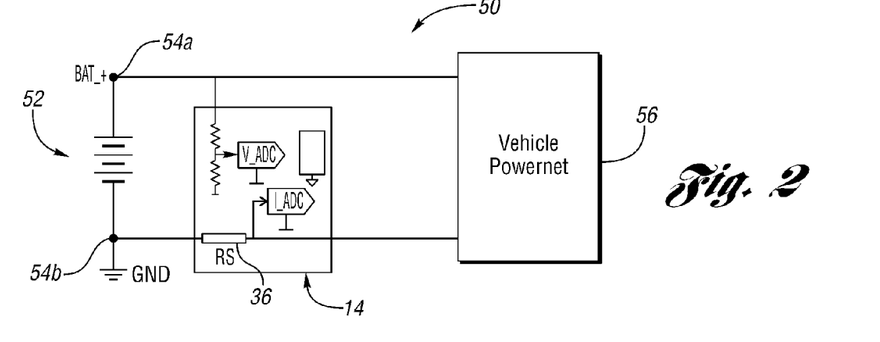
FIG. 2 illustrates a block diagram of another vehicle network having a battery and a battery monitor for measuring the battery voltage and the battery current.

Referring now to FIG. 2, with continual reference to FIGS. 1A and 1B, a block diagram of another vehicle network 50 having a battery 52 and a battery monitor 14 for measuring the voltage and the current of battery 52 is shown. Vehicle network 50 is also a type of electric direct-current ("DC") circuit. Battery 52 is a single main battery for vehicle network 50. Battery 52 includes two terminals: a positive terminal 54a and a negative terminal 54b.

Vehicle network 50 further includes a vehicle power net 56. Power net 56 includes loads of the vehicle. Positive terminal 54a (BAT_+) of battery 52 is connected to the positive of the vehicle power net. Negative terminal 54b of battery 52 is taken as the reference potential (GND). Negative terminal 54b of battery 52 is connected via current sensing shunt 36 of battery monitor 14 to the common vehicle ground (chassis). Battery 52 supplies energy to battery monitor 14 for enabling the operation of battery monitor 14.

As described above with reference to FIGS. 1A, 1B, and 2, the battery current is measured using a current sensing shunt 36 of battery monitor 14 to create a voltage drop. The voltage drop is sensed using second ADC 38 of battery monitor 14. The battery current is then calculated using Ohm's law with the voltage drop and the resistance value RS of current sensing shunt 36 being the known values in the equation. In some cases, as in electric vehicles, a redundant measure of the battery current is done to increase the safety of the system.

The battery voltage is measured using a relatively high-precision voltage divider 30 (composed of resistors R1 and R2) of battery monitor 14. The divided voltage produced by voltage divider 30 is sensed using first ADC 32 of battery monitor 14. Voltage divider 30 can be connected to a switch in order to avoid energy consumption from the battery when the vehicle is off. ADCs 32 and 38 can operate in parallel to have concurrent measures of the battery voltage and the battery current.

As indicated above, the resistance value RS of current sensing shunt 36 may change over time as current sensing shunt 36 ages and is used. If the resistance value RS of current sensing shunt 36 changes, then the battery current measured by battery monitor 14 may be measured with an unacceptable error. Embodiments of the present invention are directed to verifying that battery monitor 14 measures the battery current within certain accuracy.

Figure 3:
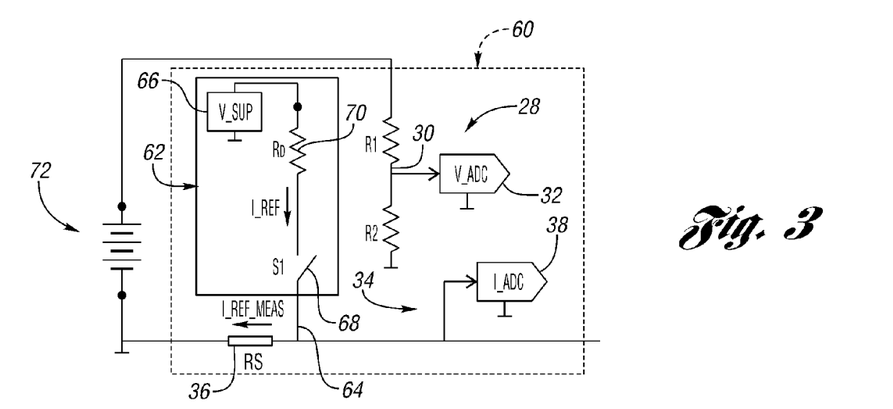
FIG. 3 illustrates a block diagram of a battery monitor in accordance with an embodiment of the present invention.

Referring now to FIG. 3, with continual reference to FIGS. 1A, 1B, and 2, a block diagram of a battery monitor 60 in accordance with an embodiment of the present invention is shown. Battery monitor 60 includes like components as battery monitor 14 and such components are designated with the same reference numerals. In particular, battery monitor 60 includes voltage measuring sub-circuit 28 and current measuring sub-circuit 34. Voltage measuring sub-circuit 28 includes voltage divider 30 composed of resistors R1 and R2. Voltage measuring sub-circuit 28 further includes first ADC 32. Current measuring sub-circuit 34 includes current sensing shunt 36 and second ADC 38.

Battery monitor 60 differs from battery monitor 14 in that battery monitor 60 further includes a controlled current source 62. Controlled current source 62 is configured to inject a relatively precise and stable reference or calibrating current I_REF into current sensing shunt 36 via an additional current path 64.

Controlled current source 62 produces the reference current I_REF relatively simply using a voltage source (V_SUP) 66, a switch (S1) 68, and a resistor 70. Switch 68 may be a MOSFET. Resistor 70 has a resistance value RD much greater than the resistance value RS of current sensing shunt 36 (i.e., RD>>RS). Resistor 70 should have a low temperature coefficient (TCR) and high value stability over time (i.e., at least equal to current sensing shunt 36). As a result, the current I_REF through resistor 70 can easily be calculated as: I_REF=V_SUP/(RD+RS)~V_SUP/RD.

In normal operation, switch 68 is opened and the current flowing through current sensing shunt 36 is the current derived from the vehicle power net (i.e., the battery current of battery 72).

When the vehicle is parked and no loads are activated, the battery current of battery 72 is zero. Consequently, the battery current flowing through current sensing shunt 36 is zero. As described in detail below, the current channel may be calibrated by closing switch 68 for a given period of time. While switch 68 is closed, controlled current source 62 produces the reference current I_REF. The reference current I_REF flows from voltage source V_SUP 66 through resistor 70 and into and through current sensing shunt 36.

Upon the reference current I_REF being injected into current sensing shunt 36, the following analysis is performed for determining whether the battery current measurement capability of battery monitor 60 should be calibrated. In general, a purpose of the analysis is to determine whether the resistance value RS of current sensing shunt 36 has changed and, if so, by how much. A change in the resistance value RS of current sensing shunt 36 once known can be taken into account for subsequent battery current measurements performed by battery monitor 60 thereby calibrating battery monitor 60. Likewise, awareness of a change in the resistance value RS of current sensing shunt 36 can trigger a warning of current defective measurement in the event that the resistance value RS is out of an acceptable range. Alternatively, if any such change in the resistance value RS of current sensing shunt 36 goes undetected and remains unaccounted for, then the subsequent battery current measurements measured by battery monitor 60 may be measured with an unacceptable error.

The analysis includes comparing (i) the reference current I_REF injected from controlled current source 62 through current sensing shunt 36 versus (ii) the reference current I_REF as measured using current sensing shunt 36. The reference current I_REF as measured using current sensing shunt 36 is the measured reference current I_REF_MEAS.

The measured reference current I_REF_MEAS is calculated from the measured voltage drop over current sensing shunt 36 and the resistance value RS of current sensing shunt 36 (i.e., I_REF_MEAS=(Voltage drop over current sensing shunt 36)/RS). As described above, the voltage drop over current sensing shunt 36 is measured by second ADC 38. The resistance value RS of current sensing shunt 36 is the currently known resistance value RS.

If the resistance value RS of current sensing shunt 36 is unchanged, then the reference current I_REF and the measured reference current I_REF_MEAS will be the same. Otherwise, if the resistance value RS of current sensing shunt 36 is changed such that the resistance value RS is some unknown value other than the value RS, then the reference current I_REF and the measured reference current I_REF_MEAS will be unequal. As such, this indicates that the actual resistance value RS of current sensing shunt 36 is different from the currently known resistance value RS of current sensing shunt 36 thereby meaning that the resistance value of current sensing shunt 36 has changed. The change is then evaluated to compensate the resistance value of current sensing shunt 36 for future measurements or to trigger a warning in case the change falls out of an acceptable range. Also, if the change is processed as not being plausible, then it can be concluded that some error in the calibrating system is present (for example, a defective I_REF) and a suitable reaction can be provided.

As described, the analysis involves battery current measurement calibration using direct current injection. In the analysis, the reference current I_REF is calculated as follows. Initially, the voltage of voltage source V_SUP 66 of controlled current source 62 is measured. The value of the reference current I_REF is then calculated according to the equation: I_REF=V_SUP_MEAS/RD; where V_SUP_MEAS is the measured voltage of voltage source V_SUP 66 and RD is the resistance value RD of resistor 70 of controlled current source 62.

In the analysis, the measured reference current I_REF_MEAS is measured as follows. Initially, the reference current I_REF injected through current sensing shunt 36 causes a voltage drop across current sensing shunt 36. Second ADC 38 measures this voltage drop. The value of the measured reference current I_REF_MEAS is then calculated according to the equation: I_REF_MEAS=(voltage drop across current sensing shunt 36)/RS; where RS is the currently known resistance value RS of current sensing shunt 36.

Further in the analysis, the reference current I_REF and the measured reference current I_REF_MEAS are then compared with one another. As indicated above, the reference current I_REF and the measured reference current I_REF_MEAS will be the equal if the resistance value RS of current sensing shunt 36 is unchanged. On the other hand, the reference current I_REF and the measured reference current I_REF_MEAS will be unequal if the resistance value RS of current sensing shunt 36 is changed.

Thus, changes in the resistance value RS of current sensing shunt 36 can be measured since the reference current I_REF injected through current sensing shunt 36 is known from a measurement independent of current sensing shunt 36 (i.e., I_REF=V_SUP/RD). It is further noted that sub-circuits 28 and 34 used for respectively measuring the voltage and the current are different so any error on either of them will also be detected.

Battery monitor 60 further includes a controller or the like (not shown) which is configured to: control operation of controlled current source 62 including switch S1 68 in generating the reference current I_REF; measure the voltage of voltage supply V_SUP 66; control ADCs 32 and 38 and receive and process their outputs; compare the value of the reference current I_REF and the value of the measured reference current I_REF_MEAS, measured using current sensing shunt 36; determine whether the resistance value RS of current sensing shunt 36 has or has not changed from this comparison and, if so, by how much; calibrate the resistance value RS such that the battery current is measured using current sensing shunt 36 with acceptable accuracy; provide a warning signal in case of excessive deviation of the resistance value RS; etc.

From the datasheets of the resistor manufacturer of resistor 70 of controlled current source 62 and using worst case analysis, the maximum deviation of the resistance value RD can be computed. In turn, the minimum and maximum bounds for the value of the reference current I_REF can be obtained for a given measured voltage of voltage source V_SUP 66 (i.e., for a given value of V_SUP_MEAS).

If controlled current source 62 includes additional switch and resistor parallel pairs, then controlled current source 62 can inject additional different reference current I_REFs into current sensing shunt 36. This enables compensation/measurement of changes in the resistance value RS of current sensing shunt 36 with several measured working points.

In the event that there is a non-zero battery current while the vehicle is parked, it is expected that this battery current will be relatively low and stable or with a low frequency change. As such, it may be possible to inject the reference current I_REF also before and after this is done to ensure that the current is stable and that the current difference is only due to the reference current I_REF.

Figure 4A:
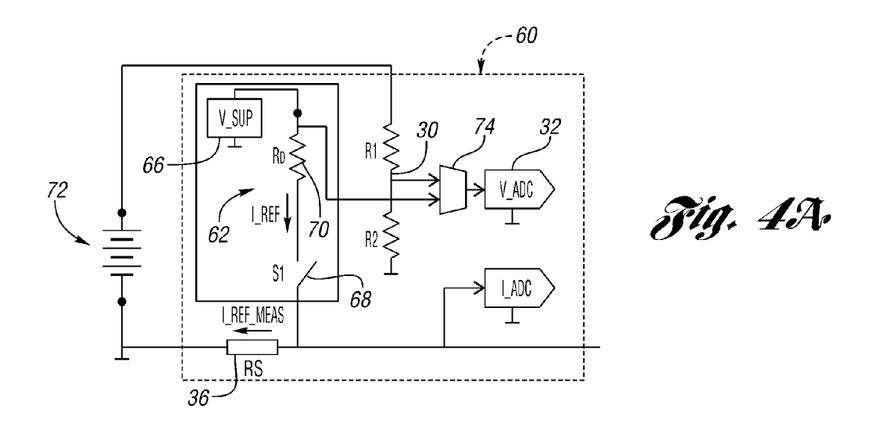
FIGS. 4A, 4B, and 4C respectively illustrate block diagrams of the battery monitor shown in FIG. 3 in accordance with first, second, and third variations.
Figure 4B:
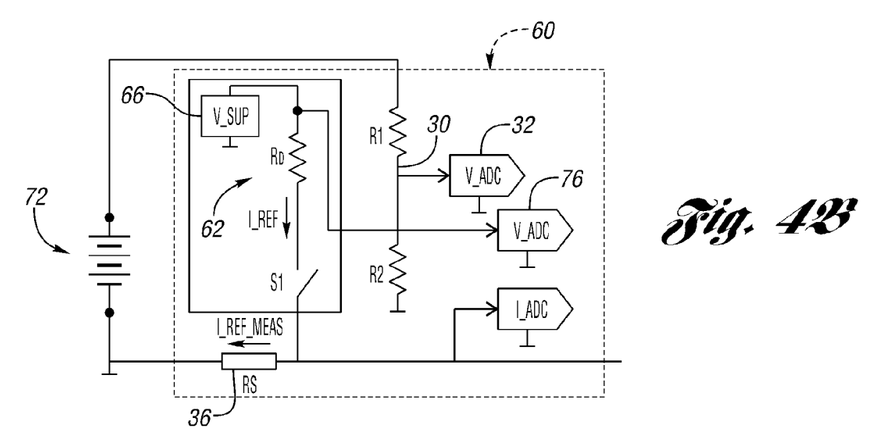
Figure 4C:
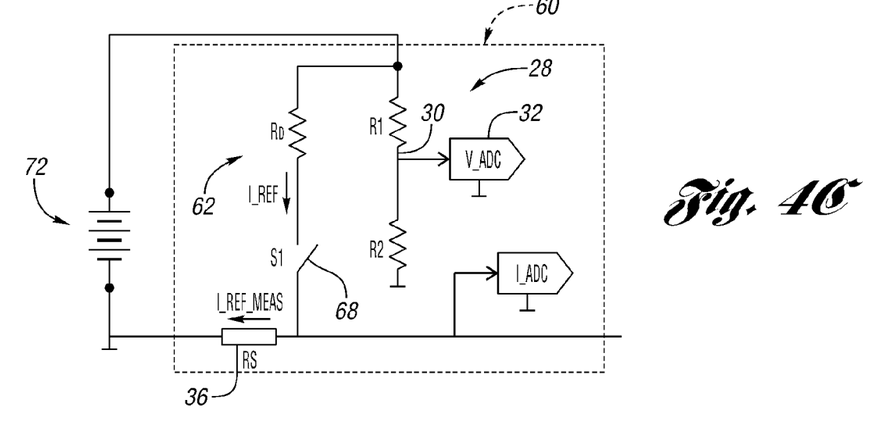

Referring now to FIGS. 4A, 4B, and 4C, with continual reference to FIG. 3, respective block diagrams of battery monitor 60 shown in FIG. 3 in accordance with first, second, and third variations are shown. The first, second, and third variations of battery monitor 60 represent respective options for measuring the voltage of voltage source V_SUP 66 of controlled current source 62 (i.e., for measuring measured V_SUP_MEAS).

In the first variation shown in FIG. 4A, voltage measuring sub-circuit 28 of battery monitor 60 further includes an analog multiplexer 74. Multiplexor 74 has two inputs for respectively receiving (i) the divided voltage produced by voltage divider 30, which is indicative of the voltage of battery 72; and (ii) the voltage of voltage source V_SUP 66. Multiplexor 74 is configured to allow one of these inputs to reach ADC 32 of voltage measuring sub-circuit 28 at a given time.

In the second variation shown in FIG. 4B, voltage measuring sub-circuit 28 of battery monitor 60 further includes an additional ADC 76. ADCs 32 and 76 respectively receive the divided voltage produced by voltage divider 30 and the voltage of voltage source V_SUP 66.

In the third variation shown in FIG. 4C, battery 72 is used as voltage source V_SUP 66. That is, in this variation, controlled current source 62 lacks voltage source V_SUP 66 and the voltage of battery 72 is used to generate the reference current I_REF when the switch 68 is closed and the external load (not shown) is disconnected from battery 72.

Figure 5:
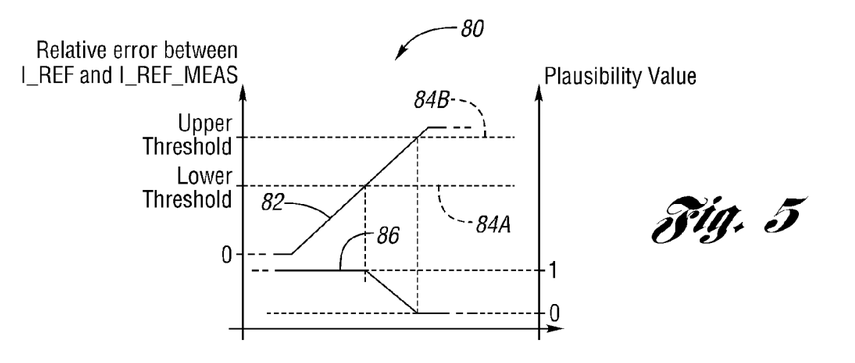
FIG. 5 illustrates a graph regarding plausibility checking between the comparison of the reference current I_REF and the measured reference current I_REF_MEAS in the calibration process of the battery monitor shown in FIG. 3.

Referring now to FIG. 5, a graph 80 regarding plausibility checking between the comparison of the measured reference current I_REF_MEAS and the reference current I_REF in the calibration process of battery monitor 60 is shown. A plausibility checking between these two values (or set of values) I_REF and I_REF_MEAS can be easily implemented. Graph 80 shows a process of calculating the plausibility value of the comparison. While the measured value I_REF_MEAS (designated by plot 82) does not exceed a predetermined lower threshold 84A, the plausibility value (designated by plot 86) of the measurement is intact (i.e., the plausibility value=1.0). Upon the measured value I_REF_MEAS exceeding the lower threshold 84A, degradation of the plausibility value is started (i.e, 1.0<the plausibility value<0). Upon the measured value I_REF_MEAS exceeding a predetermined upper threshold 84B, the plausibility value is maximally degraded reaching a minimum value (i.e., the plausibility value=0). In this case, the measured value I_REF_MEAS is not reliable and an alarm should be activated.

It is noted that the lower and upper thresholds 84A and 84B are based on the above-mentioned bounds of the reference current I_REF. Also, more complex algorithms may be considered (with historic measurements evaluation) to distinguish whether it is resistance value RS that is degraded out of an acceptable range or it is the reference current I_REF that is anomalous (for example, anomalous resistance value RD).

The resistance value RS of current sensing shunt 36 is typically a relatively low value for battery monitors. For example, the resistance value RS is typically on the order of a 100 µOhm. As such, due to the relatively low value of the shunt resistor, calibration should be done at relatively high current values to minimize error measurement in current sensing shunt 36. Relatively high reference current values are possible at end-of-line, for example, by using external sources and precision measures. However, such high relatively high reference current values can be difficult for on-board vehicle environments for practical reasons (e.g., large and expensive switches and resistors are required due to high power consumption/dissipation). Also, such systems have to be supplied from the batteries of the vehicle.

Therefore, a set of reference currents I_REF suitable for in-vehicle calibration fall in the range of 1 A-10 A. For low voltage batteries (e.g., 12V-48V), switches and resistors to implement the reference current I_REF injection path of controlled current source 62 in battery monitor 60 are available at reasonable cost and size for a solution like in FIG. 4C.

However, for high voltage batteries (e.g., 200V-500V), switches and resistors to implement the reference current I_REF injection path of controlled current source 62 may not be available as they may be relatively large and expensive. A more feasible solution to this concern is to use an internal voltage supply source supplied from the (HV or LV) batteries of the vehicle, like in FIGS. 4A and 4B. Several options are possible.

Figure 6A:
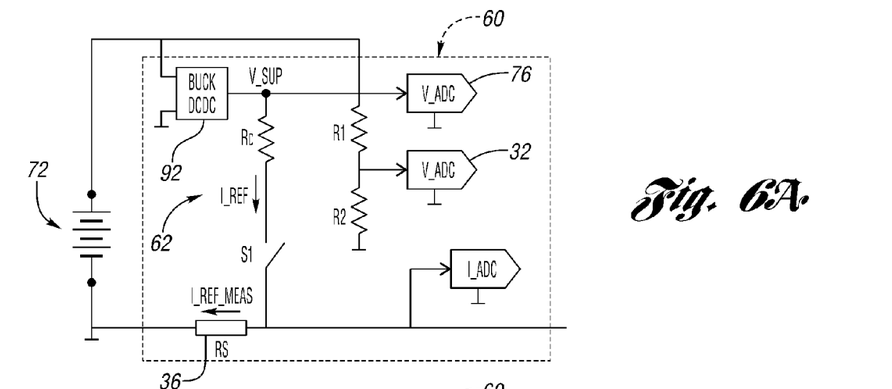
FIG. 6A illustrates a block diagram of an implementation of the reference current I_REF injection path of the controlled current source of the battery monitor shown in FIG. 3.

For instance, in one implementation, as shown in FIG. 6A, controlled current source 62 includes a DC/DC converter 92 (for example, a buck converter 92) connected to HV battery 72 instead of voltage supply V_SUP 66. Buck converter 92 converts the high voltage of HV battery 72 into a lower voltage. For instance, buck converter 92 converts the high voltage of HV battery into the voltage V_SUP referred as output of voltage supply V_SUP 66.

Figure 6B:
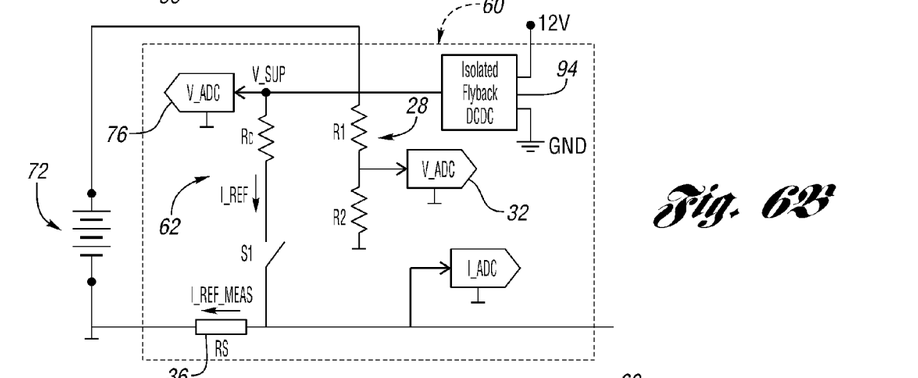
FIG. 6B illustrates a block diagram of another implementation of the reference current I_REF injection path of the controlled current source of the battery monitor shown in FIG. 3.

In another implementation, as shown in FIG. 6B, controlled current source 62 includes an isolated converter 94 as voltage supply V_SUP 66. Isolated converter 94 converts the voltage from a low-voltage 12V battery into the voltage V_SUP. This type of isolated converter is readily available as it is already used to supply HV electronic circuits (like sensors and/or microcontrollers) in battery monitor 60. However, this already existing isolated converter may be unable to provide large reference currents. As such, a possible solution is to use a bigger isolated converter which is able to deliver such large reference currents.

Figure 7:
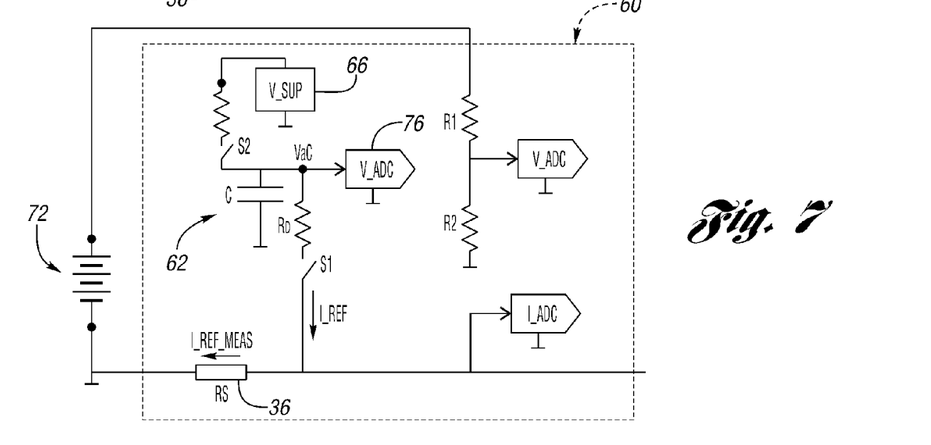
FIG. 7 illustrates a block diagram of a battery monitor in accordance with another embodiment of the present invention.

Referring now to FIG. 7, with continual reference to FIG. 3, a block diagram of battery monitor 60 in accordance with another embodiment of the present invention is shown. Initially, as described above, the analysis employed by battery monitor 60 as shown in FIG. 3 involves battery current measurement calibration using direct current injection. As will be described below, the analysis employed by battery monitor 60 as shown in FIG. 7 involves battery measurement calibration using capacitor discharge current.

The configuration of battery monitor 60 as shown in FIG. 7 is provided as an alternative for the consideration that generating a 1 A-10 A DC reference current I_REF directly from a voltage source may be too difficult or expensive (like may be in the examples described above). In the approach of battery monitor 60 as shown in FIG. 7, controlled current source 62 includes a readily available low-voltage, low-current source V_SUP 66. LV source V_SUP 66 is used to charge a capacitor C through a resistor RC at relatively low current. The charge stored in the capacitor C is subsequently used for generating the reference current I_REF.

Initially, switch S2 is ON while switch S1 is OFF. In turn, the capacitor C is charged to a certain voltage V_C. This value of voltage V_C is maintained until the vehicle is stopped and no current from the vehicle power net is flowing through current sensing shunt 36. Subsequently, to generate the reference current I_REF, switch S2 is opened (thereby disconnecting the capacitor C from the LV source V_SUP 66) and then switch S1 is closed. This process (S2ON and charge; S1ON and discharge through resistor RS) can be repeated at a given sampling rate f_S for further improvement.

The voltage V_C is then measured and the measured value of the voltage V_C (i.e., V_C_MEAS) is used to compute the value of the reference current I_REF from the equation: I_REF=(V_C_MEAS)/RD. The computed value of the reference current I_REF is then compared with the measured reference current I_REF_MEAS, which is measured using current sensing shunt 36.

With this approach, N current pairs (I_REF (i), I_REF_MEAS (i), etc.) depending on the values of RD, C, and the sampling rate f_S can be measured until a given absolute error measurement is reached. In this way, a plausibility check can be implemented as described above. After the measurement and comparison process have been completed, both switches S1 and S2 are opened whereby normal operation of HV battery 72 for driving an external load may occur.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A sensor for monitoring battery current, the sensor comprising:
a shunt having a resistance with an actual value and being in a path having a battery;
a current source configured to provide a known value of current along an additional path through the shunt when no battery current from the battery passes through the shunt; and
a controller configured to generate a measured value of the current through the shunt as a function of a measured value of voltage drop across the shunt caused by the current through the shunt and an assumed value of the resistance of the shunt;
wherein the controller is further configured to detect the assumed value of the resistance of the shunt as being different than the actual value of the resistance of the shunt when the known and measured values of the current differ.

2. The sensor of claim 1 wherein:
the controller is further configured to detect the assumed value of the resistance of the shunt as being the same as the actual value of the resistance of the shunt when the known and measured values of the current are the same.

3. The sensor of claim 1 further comprising:
an analog-to-digital converter (ADC) electrically connected to a node which is connected to one end of the shunt, the ADC configured to generate the measured value of the voltage drop across the shunt caused by the current through the shunt.

4. The sensor of claim 1 wherein:
the controller is further configured to generate a difference between the assumed and actual values of the resistance of the shunt as a function of a difference between the known and measured values of the current;
wherein the controller is further configured to calibrate the assumed value of the resistance of the shunt based on the difference between the assumed and actual values of the resistance of the shunt.

5. The sensor of claim 1 wherein:
the controller is further configured to generate a difference between the assumed and actual values of the resistance of the shunt as a function of a difference between the known and measured values of the current;
wherein the controller is further configured to calibrate the assumed value of the resistance of the shunt based on the difference between the assumed and actual values of the resistance of the shunt.

6. The sensor of claim 5 wherein:
the controller is further configured to generate a measured value of the battery current through the shunt as a function of a measured value of voltage drop across the shunt caused by the battery current through the shunt and the calibrated assumed value of the resistance of the shunt.

7. The sensor of claim 1 wherein:
the controller is further configured to calculate the known value of the current provided through the shunt independent of generating the measured value of the current through the shunt.

8. The sensor of claim 1 wherein:
the current source includes a voltage source, a resistor having a known value of resistance, and a switch connected in series to provide the known value of current through the shunt;
wherein the controller is further configured to calculate the known value of current provided through the shunt as a function of a measured voltage of the voltage source and the known value of the resistance of the resistor.

9. The sensor of claim 8 further comprising:
an analog-to-digital converter (ADC) electrically connected to anode which is electrically connected between the voltage source and the resistor, the ADC configured to generate the measured value of the voltage of the voltage source.

10. The sensor of claim 1 wherein:
the current source includes a resistor having a known value of resistance and a switch connected in series, the resistor connected at one end to the switch and connected at another end to a battery configured to supply power to an external load whereby the current source is enabled to provide the known value of current through the shunt;
wherein the controller is further configured to calculate the known value of current provided through the shunt as a function of a measured voltage of the battery and the known value of the resistance of the resistor.

11. The sensor of claim 1 wherein:
the current source includes a resistor having a known value of resistance and a switch connected in series, the current source further including an isolated DC/DC converter supplied from a low-voltage battery and the resistor being connected at one end to the switch and being connected at another end to the DC/DC converter whereby the current source is enabled to provide the known value of current through the shunt;

wherein the controller is further configured to calculate the known value of current provided through the shunt as a function of a measured voltage of the DC/DC converter and the known value of the resistance of the resistor.

12. The sensor of claim 1 wherein:

the current source includes a capacitor connected to a voltage source, a resistor having a known value of resistance, and a pair of switches connected in series to provide the known value of current through the shunt;

wherein the controller is further configured to calculate the known value of current provided through the shunt as a function of a measured voltage of the capacitor and the known value of the resistance of the resistor.

13. A sensor for monitoring battery current, the sensor comprising:

a shunt having a resistance with an actual value;

a current source configured to provide a known value of current through the shunt; and a controller configured to generate a measured value of the current through the shunt as a function of a measured value of voltage drop across the shunt caused by the current through the shunt and an assumed value of the resistance of the shunt;

wherein the controller is further configured to detect the assumed value of the resistance of the shunt as being different than the actual value of the resistance of the shunt when the known and measured values of the current differ;

wherein the current source includes a resistor having a known value of resistance and a switch connected in series, the current source further including a DC/DC converter, the resistor connected at one end to the switch and connected at another end to the DC/DC converter, the DC/DC converter connected to a battery configured to supply power to an external load whereby the current source is enabled to provide the known value of current through the shunt;

wherein the controller is further configured to calculate the known value of current provided through the shunt as a function of a measured voltage of the DC/DC converter and the known value of the resistance of the resistor.

14. A method for monitoring battery current, the method comprising:

providing a shunt having a resistance with actual value in a path having a battery;

injecting a known value of current along an additional path through the shunt when no battery current from the battery passes through the shunt;

generating a measured value of the current through the shunt as a function of a measured value of voltage drop across the shunt caused by the current through the shunt and an assumed value of the resistance of the shunt; and detecting the assumed value of the resistance of the shunt as being different than the actual value of the resistance of the shunt when the known and measured values of the current differ.

15. The method of claim 14 further comprising:

detecting the assumed value of the resistance of the shunt as being the same as the actual value of the resistance of the shunt when the known and measured values of the current are the same.

16. The method of claim 14 further comprising:

generating a difference between the assumed and actual values of the resistance of the shunt as a function of a difference between the known and measured values of the current; and calibrating the assumed value of the resistance of the shunt based on the difference between the assumed and actual values of the resistance of the shunt.

17. The method of claim 14 further comprising:

generating a difference between the assumed and actual values of the resistance of the shunt as a function of a difference between the known and measured values of the current;

calibrate the assumed value of the resistance of the shunt based on the difference between the assumed and actual values of the resistance of the shunt; and generating a measured value of the battery current through the shunt as a function of a measured value of voltage drop across the shunt caused by the battery current through the shunt and the calibrated assumed value of the resistance of the shunt.

18. The method of claim 14 further comprising:

calculating the known value of the current provided through the shunt independent of generating the measured value of the current through the shunt.

* * * * *